United States Patent [19]

Yum et al.

[11] 3,899,742

[45] Aug. 12, 1975

[54] AMPLIFIER APPARATUS HAVING COMBINED DC AND AC DEGENERATIVE FEEDBACK

[75] Inventors: Dooho Yum, Elk Grove; Peter A. Mercola; William R. Jacobs, both of Wilmette, all of Ill.

[73] Assignee: Beltone Electronics Corporation, Chicago, Ill.

[22] Filed: Mar. 20, 1974

[21] Appl. No.: 452,747

[52] U.S. Cl. .................. 330/19; 179/1 A; 179/1 F; 330/22; 330/25; 330/28

[51] Int. Cl.$^2$ .................. H03F 3/343; H03F 1/08

[58] Field of Search .............. 330/19, 22, 25, 28, 97, 330/149, 100; 179/1 A, 1 F

[56] References Cited

UNITED STATES PATENTS 3,005,958 10/1961 Grant .............................. 330/28 X
3,140,448 7/1964 Murray ............................ 330/28 X

FOREIGN PATENTS OR APPLICATIONS 1,160,013 12/1963 Germany .......................... 330/28

OTHER PUBLICATIONS

Wireless World, December 1969, p. 575.

*Primary Examiner*—James B. Mullins
*Attorney, Agent, or Firm*—Molinare, Allegretti, Newitt & Witcoff

[57] ABSTRACT

The disclosure describes apparatus and method for operating a driver element of an amplifier at a low DC output current in response to a low level fluctuating input signal and for increasing the DC output current in response to an increase in magnitude of the fluctuating input signal level so that the input signal is linearly amplified throughout a wide range of amplitudes. This technique for increasing the efficiency and linearity of the amplifier is achieved by the use of combined AC and DC degenerative feedback.

13 Claims, 3 Drawing Figures

AMPLIFIER APPARATUS HAVING COMBINED DC AND AC DEGENERATIVE FEEDBACK

BACKGROUND AND SUMMARY OF THE INVENTION

This invention relates to electronic amplifiers and more particularly relates to electronic amplifiers of high efficiency.

In order to achieve high efficiency, prior art amplifiers generally employ a class B output circuit which utilizes two output transistors or elements in a push-pull arrangement. Although class A output circuits require only a single transistor or amplifying element, in the past, such output circuits have required the use of relatively high average DC current levels in order to achieve linear amplification. Since DC current is continuously drawn for the amaplification of low-level signals, as well as large signals, such circuits are relatively inefficient.

In order to overcome the deficiency of the prior art class A amplifiers, the applicants have invented a system for amplifying an alternating or fluctuating input signal by means of a preamplifier and a driver element which develops across a load an output voltage corresponding to the alternating input signal. The output voltage has an alternating component and a DC component.

According to one feature of the invention, the driver element has an input cirucit with a non-linear input characteristic, such as a logarithmic characteristic. A bias circuit is used to produce an adjustable fixed or quiescent DC voltage on the input circuit. The preamplifier amplifies and applies the alternating signal to the input circuit of the driver element in the form of an input voltage having a fluctuating DC component and an alternating component. Degenerative AC feedback means feed a portion of the alternating component of the output voltage back to the preamplifier so that the alternating component of the driver input voltage is modified. By the use of this technique, the output voltage is forced accurately to reproduce the alternating signal at the input of the preamplifier and the input voltage of the driver element is forced to correspond inversely to the non-linear input characteristic of the driver element.

A DC feedback circuit transmits a portion of the combined fixed or quiescent DC voltage and fluctuating DC component of the driver input voltage back to the preamplifier. As a result, the fixed or quiescent DC component of the driver input voltage changes in a direction opposite the change in the fluctuating DC component so that the average DC component of the driver input voltage remains constant. By using this unique technique, the driver element is operated at a low DC output circuit current in response to a low-level alternating signal, and is operated at a DC output circuit current of increasing magnitude as the alternating signal strength increases so that the alternating signal is linearly amplified.

High efficiency results from the ability from the system to change the DC current in the output circuit of the driver element in response to changes in magnitude of the alternating signal. As a result, all the inherent advantages of class A amplifier operation are preserved, while the inefficiencies inherent in prior class A amplifiers are eliminated.

DESCRIPTION OF THE DRAWINGS

These and other advantages and features of the present invention will hereafter appear in connection with the accompanying drawings wherein like numbers refer to like parts throughout and wherein.

DESCRIPTION OF THE PREFERRED EMBODIMENT

Figure 1:
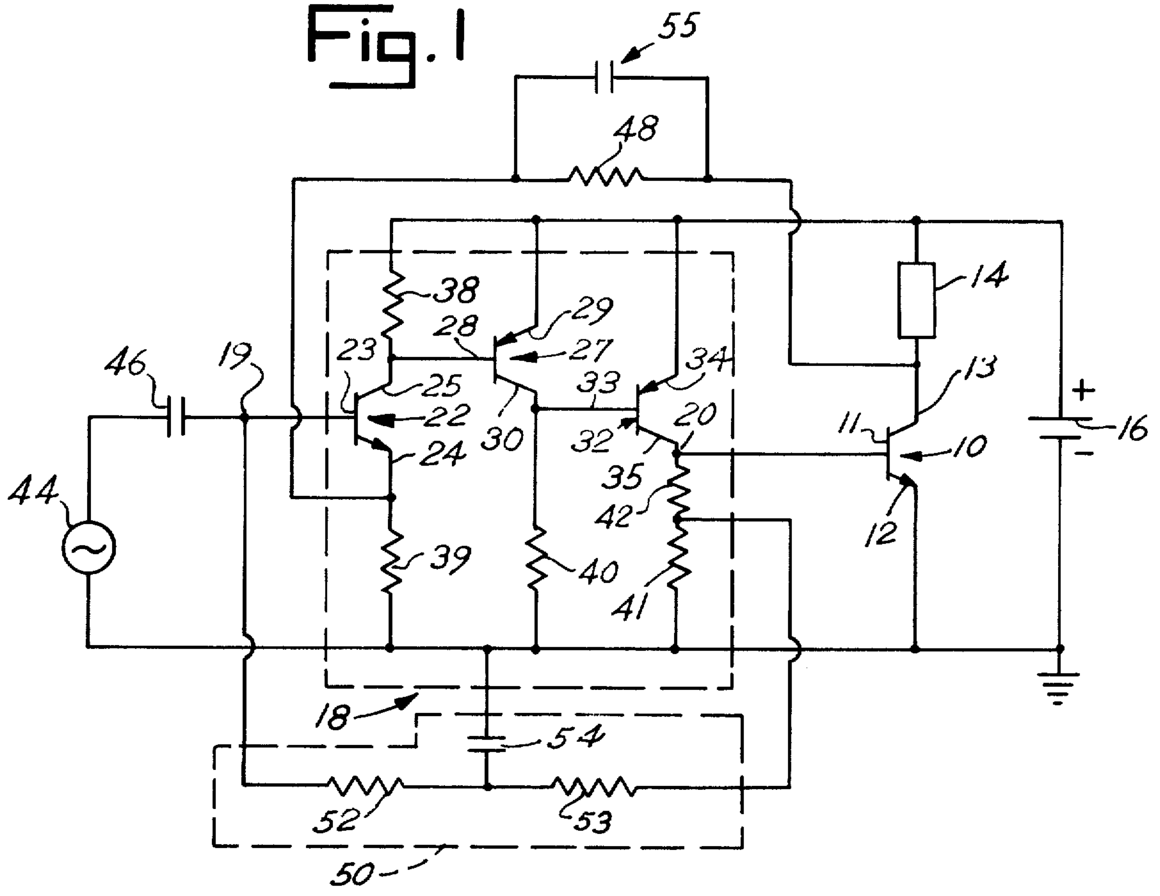
FIG. 1 is an electrical schematic diagram of a preferred form of amplifier made in accordance with the present invention.
Figure 2:
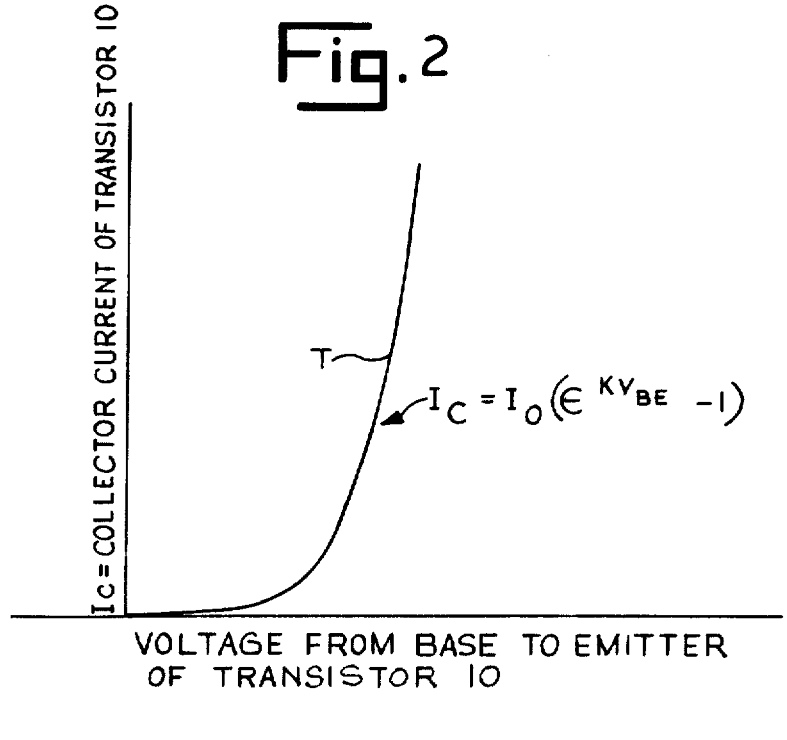
FIG. 2 is a chart schematically illustrating the input characteristic of the driver element shown in FIG. 1.

Referring to FIG. 1, the present invention may be used in connection with a conventional drive transistor 10 having a base element 11, an emitter element 12 and a collector element 13. The drive transistor includes an input circuit comprising the base-emitter junction of the transistor and an output circuit comprising the collector and emitter terminals of the transistor. Transistor 10 drives a conventional load 14. As shown in FIG. 2, the circuit of transistor 10 has a non-linear, logarithmic transfer characteristic illustrated by curve T. Power is supplied to the circuit through a conventional 1.5 volt battery 16.

Still referring to FIG. 1, a preferred form of apparatus used in connection with drive transistor 10 comprises a preamplifier circuit 18 having an input terminal 19 and an output terminal 20. Preamplifier 18 also comprises a transistor 22 having a base element 23, an emitter element 24 and a collector element 25; a transistor 27 having a base element 28, an emitter element 29, and a collector element 30; and a transistor 32 having a base element 33, an emitter element 34, and a collector element 35. The transistors are biased by resistors 38–42 connected as shown. Transistor 32 and resistors 41 and 42 comprise a biasing circuit which establishes an adjustable, fixed component of quiescent voltage at output terminal 20. The preamplifier amplifies an alternating or fluctuating sinusoidal input signal obtained from a generator source 44 and transmitted to input terminal 19 through a coupling capacitor 46.

Still referring to FIG. 1, a degenerative AC feed-back resistor 48 is connected between collector 13 of transistor 10 and emitter resistor 39 of transistor 22.

A DC feedback circuit 50 comprises series resistors 52, 53 and a shunt capacitor 54 connected as shown. Capacitor 54 filters the AC components of the driver input voltage present at output terminal 20.

The preferred values of the components shown in FIG. 1 are given in the following Table A:

TABLE A

| TRANSISTORS | TYPE |
|---|---|
| 10, 22 | 2N3414 |
| 27, 32 | 2N4033 |
| RESISTORS | VALUE IN OHMS |
| 38 | 100K |
| 39 | 1.5K |
| 40 | 68K |
| 41 | 10K |
| 42 | 2.2K |
| 48 | 300K |

TABLE A-Continued

| | |
|---|---|
| 52 | 150K |
| 53 | 220K |
| CAPACITOR | VALUE IN MICRO FARADS |
| 54 | 1.5 |
| 55 | $1 \times 10^{-5}$ |
| LOAD | |
| 14 | 200 DC Earphone |

The operation and method aspect of the preferred embodiment shown in FIG. 1 will now be described in connection with FIG. 3. Those skilled in the art will appreciate that the alternating signal provided by source 44 is amplified and phase inverted by each of the transistors 22, 27 and 32. As a result, the phase of the alternating signal on input terminal 19 is opposite the phase of the alternating signal on output terminal 20.

Resistor 42 is selected so that the fixed or quiescent DC voltage VO at terminal 20 is about 0.52 volts when source 44 is disconnected from input terminal 19. Voltage VO corresponds to operating point OPO on transfer characteristic curve T of FIG. 3 and results in an output current Io through load 14 of about 1 milliamp of DC current.

If source 44 were connected to terminal 19 through capacitor 46 and feedback network 50 were opened, AC feedback resistor 48 would force the output voltage at the collector of transistor 10 to a sinusoidal state corresponding to the sinusoidal alternating signal produced by generator 44. Feedback resistor 48 also would force the driver input voltage on terminal 20 to a logarithmic state illustrated by curve LI1 in FIG. 3.

Figure 3:
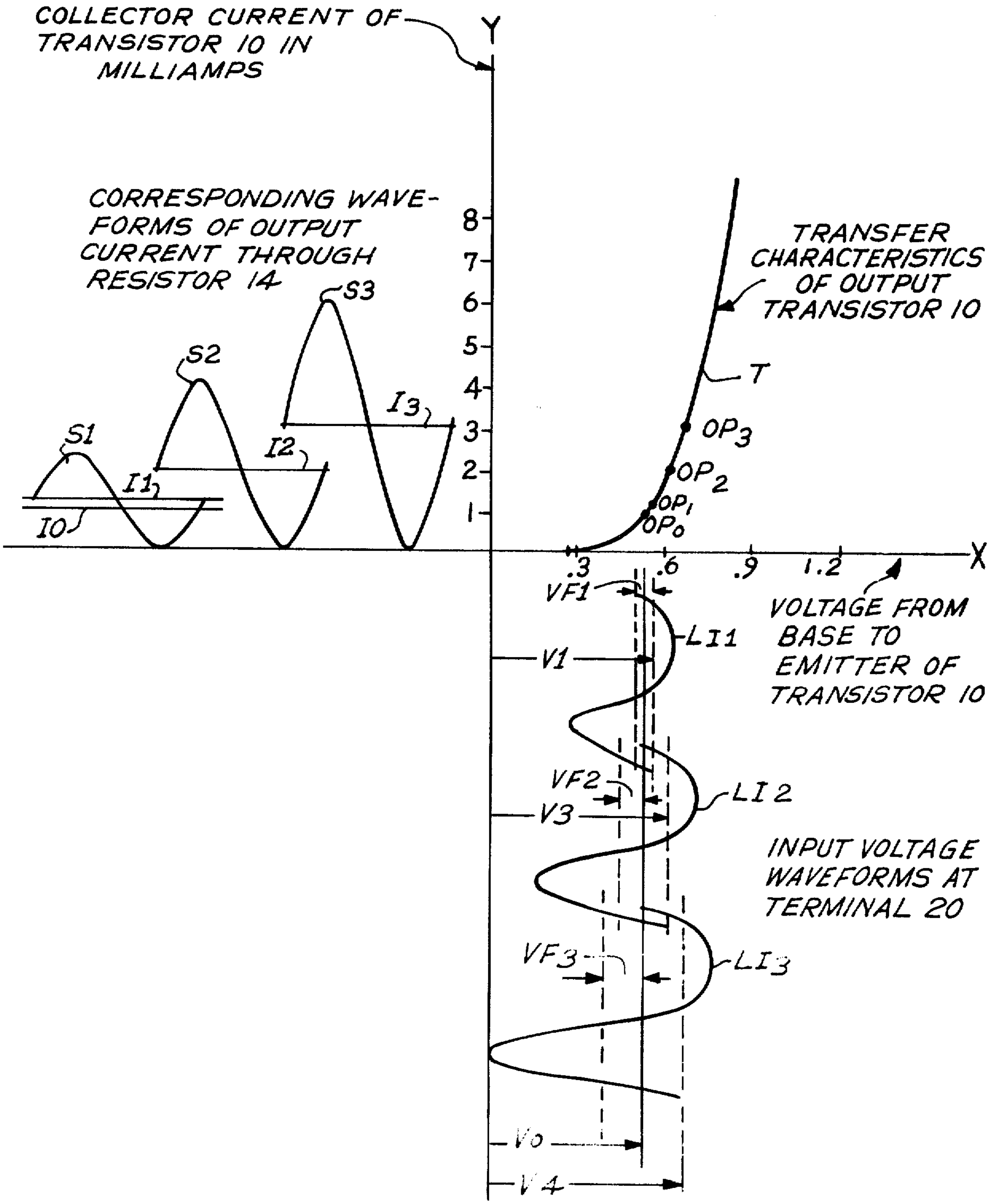
FIG. 3 is a chart showing the manner in which the circuitry of FIG. 1 alters the operation of the driver element in response to alternating input signals of varying magnitude.

Signal LI1 would have a negative fluctuating DC component VF1 illustrated in FIG. 3. Assuming the fluctuating DC component VF1 is 0.05 volt, the average DC voltage at output terminal 20 would be 0.52 volts minus 0.05 volt or 0.47 volt. Nonetheless, because of the nonlinear transfer characteristic of transistor 10, the DC component of current through resistor 14 would continue to be about 1 milliamp (i.e., current $I_o$).

If the DC current flowing in the output circuit through load 14 were not increased as the input signal magnitude increases, the output signal across load 14 would be severely clipped or distorted. In order to avoid this result, feedback circuit 50 filters the alternating components of the voltage appearing at terminal 20 and transmits to input terminal 19 both the fixed DC voltage component due to resistors 41 and 42 and the fluctuating DC voltage component due to signal LI1. Preamplifier 18 inverts the DC feedback voltage and applies it to terminal 20. When signal KI1 is applied to terminal 20, the average DC bias voltage at junction 20 is increased by the amount of voltage VF1 to the level of voltage VO. The average voltage of signal KI1 also is VO. That is, the area under the LI1 curve to the right of line VO equals the area under the KI1 curve to the left of line VO.

Due to the non-linear transfer characteristic of transistor 10, raising the average DC bias level to voltage VO raises the effective operating level to point OP1 which corresponds to voltage V1. The difference between voltages V1 and VO equals the magnitude of voltage VF1. Due to this unique operation, the average DC output current is raised to level I1, and logarithmic signal LI1 results in a sinusoidal output signal S1. As shown in FIG. 3, the average value of signal S1 is I1.

That is, the area under curve S1 above line I1 equals the area under curve S1 below line I1.

As the magnitude of the input signal from generator 44 increases, the magnitude of the corresponding logarithmic signal at terminal 20 also increases and the resulting operating point is shifted upward proportionately. For example, signal LI2 has a negative fluctuating DC component VF2 which would tend to decrease the average DC bias voltage at terminal 20 in the absence of feedback network 50. However, if the DC voltage at terminal 20 tends to decrease, a portion of the voltage is fed back to input terminal 19. The voltage fed back to terminal 19 is inverted by preamplifier 18 and applied to terminal 20, thereby maintaining the average DC bias on terminal 20 at voltage VO. This mode of operation increases the effective operating level to point OP2 which corresponds to voltage V3. The resulting sinusoidal output signal S2 has an average DC current I2 which is larger than DC current I1.

In a similar manner, if the sinusoidal input signal at terminal 19 is again increased, feedback resistor 48 forces the voltage on terminal 20 to a logarithmic waveform, such as signal LI3. Signal LI3 has a negative fluctuating DC voltage component VF3 which would tend to decrease the average bias voltage at terminal 20 in the absence of feedback network 50. However, network 50 and preamplifier 18 add the magnitude of voltage VF3 to the voltage at terminal 20 in order to maintain the average DC voltage on terminal 20 at level VO. As a result, the average voltage of signal LI3 is VO. (The area under curve LI3 to the right of line VO equals the area under curve LI3 to the left of line VO.) This mode of operation increases the effective operating level to point OP3 which corresponds to voltage V4. The resulting sinusoidal output signal S3 has an average DC current value I3 which is large enough to prevent clipping and distortion.

By using the foregoing techniques, the amplifier is extremely efficient since only a minute DC current flows in resistor 14 for low level input signals from source 44. The system automatically increases the DC bias current flowing through load 14 as the input signal increases in amplitude so that distortion in the output signal is reduced to a minimum.

Those skilled in the art will recognize that the preferred embodiment of the invention disclosed herein can be altered and modified without departing from the true spirit and scope of the invention as defined in the accompanying claims.

What is claimed is:

1. In a system for amplifying an alternating input signal including a driver element comprising a driver input circuit having a non-linear characteristic and a driver output circuit for conducting an output current corresponding to the alternating input signal through a load, said output current having an alternating component and a DC component, improved apparatus for varying the DC component of current flowing in the output circuit to improve the efficiency and linearity of the system comprising in combination:

bias means for producing a quiescent DC voltage on the driver input circuit which maintains the DC component of the driver element output current at a low level in the absence of an alternating input signal;

preamplifier means having an input terminal adapted to receive the input signal and an output terminal coupled to the driver input circuit for producing a driver input voltage on the output terminal;

degenerative AC feedback means for feeding a portion of the alternating component of the output current back to the preamplifier so as to reduce the amplitude of the alternating input signal and to allow the alternating input signal to be modified by the non-linear characteristic of the driver input circuit in order to produce a non-linear form of driver input voltage; and DC feedback means for applying at least a portion of the DC voltage on the driver input circuit to the preamplifier means so as to urge the average DC voltage on the driver input circuit in a direction which increases the DC component of the driver element output current as the magnitude of the alternating input signal increases to provide linear amplification of the alternating input signal.

2. Apparatus, as claimed in claim 1, wherein the degenerative AC feedback means comprises a resistor.

3. Apparatus, as claimed in claim 2, wherein the resistor is connected between the output circuit of the driver element and the input terminal of the preamplifier means.

4. Apparatus, as claimed in claim 1, wherein the DC feedback means comprises filter means for filtering any alternating component of the driver input voltage and passing any DC component of the driver input voltage.

5. Apparatus, as claimed in claim 4, wherein the filter means comprises a resistor and a capacitor.

6. Apparatus, as claimed in claim 1, wherein the DC feedback means is connected between portions of the preamplifier means in phase opposition.

7. Apparatus, as claimed in claim 1, wherein the DC feedback means includes means for overcoming the tendency of the non-linear form of the driver input voltage to decrease the magnitude of the average DC voltage on the driver input circuit and for maintaining the average DC voltage on the driver input circuit substantially constant.

8. Apparatus, as claimed in claim 1, wherein the nonlinear transfer characteristic is a logarithmic characteristic.

9. Apparatus, as claimed in claim 8, wherein the alternating input signal is sinusoidal and the driver input voltage is logarithmic.

10. In a system for amplifying an alternating input signal including a bipolar transistor having a base, an emitter directly connected to a source of common potential and a collector for conducting a load current through a load, the load current including a DC output component and an AC output component having a first predetermined phase, improved apparatus for varying the DC component of current flowing in the load to improve the efficiency and linearity of the system comprising:

bias means for producing a quiescent Dc voltage between the base and emitter which maintains the DC component of the current flowing in the load at a low level in the absence of an alternating input signal;

preamplifier means connected to the source of common potential and having an input terminal adapted to receive the input signal and an output terminal coupled to the base for applying the input signal to the base with a second predetermined phase;

degenerative AC feedback means for feeding back a portion of the AC output component of current to a part of the preamplifier means in which the input signal has a phase opposite the first predetermined phase; and negative DC feedback means for feeding at least a portion of the DC voltage on the base back to a part of the preamplifier means at which the phase of the input signal is opposite the second predetermined phase, whereby the DC output component is maintained at a low magnitude in response to a low level input signal and the magnitude of the DC output component is increased as the amplitude of the input signal increases.

11. Apparatus, as claimed in claim 10, wherein the negative DC feedback means comprises filter means for passing only the DC voltage on the base.

12. Apparatus, as claimed in claim 10, wherein the negative DC feedback means includes means for maintaining the average DC voltage on the base substantially constant as the amplitude of the input signal increases.

13. Apparatus, as claimed in claim 10, wherein the source of common potential is ground potential.

* * * * *